United States Patent
Ueno et al.

(10) Patent No.: US 10,501,710 B2
(45) Date of Patent: *Dec. 10, 2019

(54) CLEANER COMPOSITION AND PREPARATION OF THIN SUBSTRATE

(71) Applicant: Shin-Etsu Chemical Co., Ltd., Tokyo (JP)

(72) Inventors: Masaya Ueno, Annaka (JP); Hideyoshi Yanagisawa, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 179 days.

This patent is subject to a terminal disclaimer.

(21) Appl. No.: 15/490,041

(22) Filed: Apr. 18, 2017

(65) Prior Publication Data

US 2017/0306273 A1  Oct. 26, 2017

(30) Foreign Application Priority Data

Apr. 26, 2016 (JP) ................................. 2016-088020

(51) Int. Cl.
| | | |
|---|---|---|
| *C11D 7/26* | (2006.01) | |
| *C11D 7/50* | (2006.01) | |
| *B08B 3/04* | (2006.01) | |
| *B08B 3/08* | (2006.01) | |
| *C11D 11/00* | (2006.01) | |
| *C11D 7/06* | (2006.01) | |
| *C11D 7/32* | (2006.01) | |
| *H01L 21/683* | (2006.01) | |
| *H01L 21/304* | (2006.01) | |
| *H01L 21/02* | (2006.01) | |
| *C11D 3/18* | (2006.01) | |
| *B08B 3/10* | (2006.01) | |
| *C11D 3/20* | (2006.01) | |
| *C11D 3/04* | (2006.01) | |
| *C11D 3/30* | (2006.01) | |

(52) U.S. Cl.
CPC ............ *C11D 11/0047* (2013.01); *B08B 3/04* (2013.01); *B08B 3/08* (2013.01); *B08B 3/10* (2013.01); *C11D 3/044* (2013.01); *C11D 3/181* (2013.01); *C11D 3/201* (2013.01); *C11D 3/2003* (2013.01); *C11D 3/2006* (2013.01); *C11D 3/2041* (2013.01); *C11D 3/2065* (2013.01); *C11D 3/2068* (2013.01); *C11D 3/30* (2013.01); *C11D 7/06* (2013.01); *C11D 7/261* (2013.01); *C11D 7/3209* (2013.01); *C11D 7/5022* (2013.01); *C11D 7/5027* (2013.01); *H01L 21/02068* (2013.01); *H01L 21/304* (2013.01); *H01L 21/6836* (2013.01)

(58) Field of Classification Search
CPC ....... C11D 3/044; C11D 3/181; C11D 3/2003; C11D 3/2006; C11D 3/201; C11D 3/2041; C11D 3/2065; C11D 3/2068; C11D 3/30; B08B 3/04; B08B 3/08; B08B 3/10
USPC ....... 510/175, 176, 245, 254, 255, 259, 264, 510/272; 134/1.2, 1.3, 22.18, 34, 39
See application file for complete search history.

(56) References Cited

U.S. PATENT DOCUMENTS

| | | | | |
|---|---|---|---|---|
| 2004/0142835 A1* | 7/2004 | Takashima | ........... | C11D 3/2034 510/175 |
| 2009/0001315 A1* | 1/2009 | Ishikawa | ................. | C03C 15/00 252/79.5 |
| 2009/0020140 A1* | 1/2009 | Wan | ..................... | C11D 7/5018 134/13 |
| 2010/0279910 A1* | 11/2010 | Lee | ........................ | C11D 1/22 510/176 |
| 2011/0146724 A1* | 6/2011 | Lee | ........................ | G03F 7/425 134/26 |
| 2011/0247660 A1* | 10/2011 | Lee | ........................ | G03F 7/425 134/26 |
| 2014/0357052 A1 | 12/2014 | Ueno et al. | | |
| 2015/0133356 A1 | 5/2015 | Pollard et al. | | |
| 2016/0032227 A1* | 2/2016 | Mochida | ................ | C11D 3/373 510/175 |

FOREIGN PATENT DOCUMENTS

| | | |
|---|---|---|
| EP | 2 551 322 A1 | 1/2013 |
| JP | 2006-343604 A | 12/2006 |
| JP | 2013-10888 A | 1/2013 |
| WO | 2013/187313 A1 | 12/2013 |

OTHER PUBLICATIONS

Extended European Search Report dated Sep. 8, 2017, issued in counterpart European Application No. 17167518.4. (9 pages).
Office Action dated May 7, 2019, issued in counterpart JP Application No. 2016-088020, with English translation. (8 pages).

* cited by examiner

*Primary Examiner* — Gregory R Delcotto
(74) *Attorney, Agent, or Firm* — Westerman, Hattori, Daniels & Adrian, LLP

(57) ABSTRACT

A cleaner composition consisting essentially of (A) 90.0-99.9 wt % of an organic solvent and (B) 0.1-10.0 wt % of a $C_3$-$C_6$ alcohol, and containing (C) 20-300 ppm of sodium and/or potassium is effective for cleaning a surface of a silicon semiconductor substrate. A satisfactory degree of cleanness is achieved within a short time and at a high efficiency without causing corrosion to the substrate.

11 Claims, No Drawings

CLEANER COMPOSITION AND PREPARATION OF THIN SUBSTRATE

CROSS-REFERENCE TO RELATED APPLICATION

This non-provisional application claims priority under 35 U.S.C. § 119(a) on Patent Application No. 2016-088020 filed in Japan on Apr. 26, 2016, the entire contents of which are hereby incorporated by reference.

TECHNICAL FIELD

This invention relates to a cleaner composition used for the removal of adhesive and contaminants on semiconductor substrates, and a method for preparing thin substrates.

BACKGROUND ART

The recent microelectronic technology continues to advance the miniaturization and integration of various substrates. In the case of semiconductor packaging, for example, three-dimensional packaging is employed to achieve a higher density and capacity. In the 3D semiconductor packaging technology, individual semiconductor chips are made thin and stacked in multilayer structure while they are connected by TSV (through silicon vias). To accomplish the 3D package, the step of thinning a substrate having a semiconductor circuit formed therein by back grinding and the step of forming electrodes inclusive of TSV on the back surface are necessary. As the thinning step, it is proposed to bond a substrate having a semiconductor circuit formed therein to a handle substrate of silicon, glass or the like via adhesive, yielding a substrate assembly which withstands subsequent processing steps such as back grinding and back electrode formation. After the processing steps, the handle substrate must be separated in a simple manner. After the separation of the handle substrate, the adhesive remaining on the semiconductor circuit-bearing surface of the substrate must be removed. Finally, the semiconductor circuit-bearing surface of the substrate must be cleaned. Besides, since a high temperature of above 150° C. can be encountered in the processing steps, the adhesive is required to be fully heat resistant. Thus silicone base adhesives are often used because of heat resistance.

When the substrate surface is cleaned, however, use of only an organic solvent for dissolving the adhesive is difficult to fully remove the residual adhesive. Since the substrate surface then has a contact angle with water of at least 100°, it is anticipated that failures such as defective bond of encapsulant will occur in the subsequent steps. There is a desire to have a cleaning agent capable of fully removing the residual adhesive in a short time without causing corrosion to the substrate surface. At present, there has been proposed no cleaning agent capable of fully cleaning the silicone-contaminated substrate surface in a short time.

Patent Document 1 discloses a cleaner composition for cleaning semiconductor substrates.

CITATION LIST

Patent Document 1: JP-A 2013-010888

SUMMARY OF INVENTION

An object of the invention is to provide a cleaner composition which is used in the cleaning of substrates, typically silicon semiconductor substrates, and is capable of fully removing contaminants such as adhesive residues, typically silicone adhesive residues on the substrates in a short time, i.e., efficiently cleaning the substrates without causing corrosion to the substrates. Another object is to provide a method for preparing a thin substrate.

The inventors have found that a cleaner composition consisting essentially of (A) 90.0 to 99.9% by weight of an organic solvent and (B) 0.1 to 10.0% by weight of an alcohol of 3 to 6 carbon atoms, and containing (C) 20 to 300 ppm of sodium and/or potassium, when applied to a surface of a substrate, typically semiconductor substrate, achieves effective cleaning in a short time. Even when the substrate is contaminated with silicone base adhesive, the cleaner composition ensures full removal of such contaminants. The cleaner composition is capable of effectively cleaning the semiconductor substrate without causing corrosion thereto.

The cleaner composition consists essentially of components (A) to (C) in a specific proportion and is substantially free of water. Using the cleaner composition, a substrate can be efficiently cleaned without corrosion. Particularly when a silicon semiconductor substrate is contaminated with silicone base adhesive so that it may have a contact angle with water of at least 100°, the cleaner composition is effective. That is, even when a silicon semiconductor substrate is contaminated with silicone residues and has a contact angle with water of at least 100° after a thinning step, the cleaner composition is capable of fully cleaning the substrate surface within a short time. The contaminants are removed from the substrate surface to such an extent that the substrate has a contact angle with water of less than 100°.

In one aspect, the invention provides a cleaner composition for cleaning a surface of a substrate, consisting essentially of (A) 90.0 to 99.9% by weight of an organic solvent exclusive of an alcohol of 3 to 6 carbon atoms, and (B) 0.1 to 10.0% by weight of an alcohol of 3 to 6 carbon atoms, the composition containing (C) sodium and/or potassium in an amount of 0.002 to 0.03 part by weight per 100 parts by weight of components (A) and (B) combined.

In a preferred embodiment, component (C) is present in the form of sodium hydroxide and/or potassium hydroxide.

In a preferred embodiment, the organic solvent (A) is an aliphatic hydrocarbon of 5 to 20 carbon atoms, more preferably a dialkylene glycol dialkyl ether of 5 to 20 carbon atoms.

The cleaner composition may further contain a quaternary ammonium salt.

Often the substrate is a semiconductor substrate.

In another aspect, the invention provides a method for preparing a thin substrate, comprising the steps of (a) forming an adhesive layer on a substrate or handle substrate from an adhesive composition and bonding the substrate and the handle substrate via the adhesive layer, (b) processing the substrate bonded to the handle substrate, (c) separating the substrate as processed from the handle substrate, the adhesive layer remaining on the substrate after separation, and (d) cleaning away the adhesive layer on the substrate with the cleaner composition defined above.

Typically, the adhesive composition comprises a silicone compound, which is preferably a (partial) dehydration condensate of a linear or branched organopolysiloxane having at least two silicon-bonded hydroxyl groups with an organopolysiloxane resin comprising $R_3SiO_{1/2}$ units wherein R is a monovalent hydrocarbon group and $SiO_2$ units and containing a hydroxyl group.

Advantageous Effects of Invention

When applied to a substrate, typically silicon semiconductor substrate, having contaminants such as silicone adhesive residues deposited thereon, the cleaner composition is effective for removing the contaminants from the substrate surface within a short time. The cleaner composition is capable of efficiently cleaning the substrate without causing corrosion thereto.

DESCRIPTION OF PREFERRED EMBODIMENTS

One embodiment of the invention is a cleaner composition consisting essentially of (A) 90.0 to 99.9% by weight of an organic solvent exclusive of an alcohol of 3 to 6 carbon atoms and (B) 0.1 to 10.0% by weight of an alcohol of 3 to 6 carbon atoms, the composition containing (C) sodium and/or potassium in an amount of 0.002 to 0.03 part by weight per 100 parts by weight of components (A) and (B) combined, i.e., a concentration of 20 to 300 ppm. The cleaner composition is used for cleaning a surface of a substrate, typically silicon semiconductor substrate.

Component (A) is an organic solvent exclusive of an alcohol of 3 to 6 carbon atoms. Suitable organic solvents include aliphatic hydrocarbons of 5 to 20 carbon atoms, preferably 7 to 15 carbon atoms, and more preferably 8 to 12 carbon atoms, for example, octane, nonane, decane, undecane, dodecane, tetradecane, hexadecane, isooctane, isononane, isodecane, isododecane, alkylcyclohexanes, and p-menthane, which may be used alone or in admixture.

Also included in the organic solvent (A) are dialkylene glycol dialkyl ethers of 5 to 20 carbon atoms, preferably 6 to 15 carbon atoms, and more preferably 6 to 10 carbon atoms. Exemplary ethers include diethylene glycol dimethyl ether, diethylene glycol diethyl ether, diethylene glycol dibutyl ether, and dipropylene glycol dimethyl ether, which may be used alone or in admixture.

The concentration of component (A) is from 90.0% to 99.9% by weight of the composition, the upper limit being the balance after subtraction of component (B). The concentration of component (A) is preferably from 91.5% to 99.6% by weight, more preferably from 93.8% to 99.0% by weight. If the concentration of component (A) is less than 90.0% by weight of the overall composition, a trace amount of adhesive residue is not dissolved away, indicating shortage of cleaning ability. When the organic solvent is used alone, the cleaning effect is insufficient.

According to the invention, only the organic solvent is used as the solvent. The cleaner composition is substantially free of water. This enables cleaning of the substrate with the minimized risk of metal contamination because water can be a source of metal contamination.

Component (B) is an alcohol of 3 to 6 carbon atoms, i.e., a compound of 3 to 6 carbon atoms having at least one hydroxyl group in the molecule. Suitable alcohols include saturated aliphatic alcohols of 3 to 6 carbon atoms, preferably 3 to 5 carbon atoms. Exemplary of the saturated aliphatic monohydric alcohol are n-propyl alcohol, isopropyl alcohol, 1-butanol, 2-butanol, isobutyl alcohol, tert-butyl alcohol, 1-pentanol, 2-pentanol, 3-pentanol, 2-methyl-1-butanol, isopentyl alcohol, sec-butyl alcohol, tert-pentyl alcohol, 3-methyl-2-butanol, neopentyl alcohol, 1-hexanol, 2-methyl-1-pentanol, 4-methyl-2-pentanol, and 2-ethyl-1-butanol, which may be used alone or in admixture.

The concentration of component (B) is 0.1% to 10.0% by weight, preferably 0.4% to 8.5% by weight, more preferably 1.0% to 6.2% by weight of the composition. If the concentration of component (B) is less than 0.1% by weight of the overall composition, excessive alkali ingredient may settle down, resulting in a precipitate. If the concentration of component (B) exceeds 10.0% by weight, the cleaning effect may be weak or liquid separation may occur.

The cleaner composition contains (C) sodium and/or potassium in an amount of 0.002 to 0.03 part by weight per 100 parts by weight of components (A) and (B) combined, i.e., a concentration of 20 to 300 ppm.

Component (C) is sodium and/or potassium. These metal elements may be present as ion, molecule or other chemical species in the cleaner composition while they may be in either solid or liquid state, with their form being not particularly limited. For example, component (C) may be present in the cleaner composition in ion form, i.e., in the form of a sodium or potassium compound, typically sodium hydroxide or potassium hydroxide. According to the invention, Na and/or K is present in a concentration of 20 to 300 ppm, that is, in an amount of 0.002 to 0.03 part by weight per 100 parts by weight of components (A) and (B) combined, preferably 0.004 to 0.015 part, more preferably 0.005 to 0.012 part by weight per 100 parts by weight of components (A) and (B) combined. If the Na and/or K concentration is less than 20 ppm based on the cleaner composition, a trace amount of adhesive residue may not be dissolved away, indicating shortage of cleaning ability. If the Na and/or K concentration exceeds 300 ppm, the cleaning effect is saturated, and corrosion of the substrate may occur.

The cleaner composition may further contain a quaternary ammonium salt.

Typical of the quaternary ammonium salt is tetrabutylammonium hydroxide. When used, the quaternary ammonium salt is preferably present in an amount of 0.001 to 0.1 part by weight per 100 parts by weight of components (A) and (B) combined. Other components may be added to the cleaner composition as long as the cleaning ability is not impaired.

The cleaner composition is obtained by mixing components (A) to (C) and optional components. The order of mixing components is arbitrary as long as there arise no problems interfering with the objects of the invention, such as precipitation and liquid separation. Specifically, two or three (or more) of the components are previously mixed and any remaining components are then mixed with the premix. Alternatively, all components are mixed at a time.

Using the cleaner composition, substrates, typically silicon semiconductor substrates are cleaned. Then the substrate can be cleaned in a short time. Efficient full cleaning of the substrate is possible.

The cleaner composition is used for removing contaminants on the surface of various substrates, typically silicon semiconductor substrates and cleaning the substrate surface. The substrate to be cleaned is not limited to the silicon semiconductor substrate, and examples include germanium substrates, gallium arsenide substrates, gallium phosphide substrates, gallium arsenide aluminum substrates, aluminized silicon substrates, copper-plated silicon substrates, silver-plated silicon substrates, gold-plated silicon substrates, titanium-plated silicon substrates, silicon nitride film-bearing silicon substrates, silicon oxide film-bearing silicon substrates, polyimide film-bearing silicon substrates, glass substrates, quartz substrates, liquid crystal substrates, and organic EL substrates.

Contaminants deposited on the substrate and to be removed are typically adhesive residues on the substrate surface or in substrate circuits after processing of the substrate. The cleaner composition of the invention is especially suited for the removal and cleaning of silicone base adhesive residues containing silicone compounds.

The cleaner composition is advantageously used in the method for preparing a thin substrate which finds use in the TSV or semiconductor packaging technology of the recent interest. Another embodiment of the invention is a method for preparing a thin substrate, comprising the steps of (a) forming an adhesive layer on a substrate or handle substrate from an adhesive composition and bonding the substrate and the handle substrate via the adhesive layer, (b) processing the substrate bonded to the handle substrate, (c) separating the substrate as processed from the handle substrate, some adhesive layer remaining on the substrate after separation, and (d) cleaning away the adhesive layer on the substrate with a cleaner composition wherein the cleaning step (d) uses the cleaner composition defined above.

In step (a), the adhesive composition is used to bond the substrate to the handle substrate while it may be selected from silicone, acrylic resin, epoxy resin, polyamide, polystyrene, polyimide and phenolic resin based adhesives. In particular, the cleaner composition of the invention is effective for cleaning away silicone base adhesive residues.

The silicone base adhesive composition is preferably one comprising a (partial) dehydration condensate of a linear or branched organopolysiloxane having at least two silicon bonded hydroxyl groups and an organopolysiloxane resin comprising $R_3SiO_{1_2}$ units wherein R is a monovalent hydrocarbon group and $SiO_2$ units and containing a hydroxyl group.

The linear or branched organopolysiloxane preferably has the general formula (1).

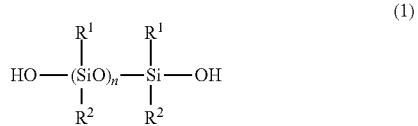

(1)

Herein $R^1$ and $R^2$ are each independently a substituted or unsubstituted, $C_1$-$C_{10}$ monovalent hydrocarbon group, and n is an integer, specifically an integer of 1,000 to 100,000.

Examples of the monovalent hydrocarbon groups $R^1$ and $R^2$ include alkyl groups such as methyl, ethyl, n-propyl, isopropyl, n-butyl, tert-butyl, n-pentyl, cyclopentyl, and n-hexyl, cycloalkyl groups such as cyclohexyl, and aryl groups such as phenyl and tolyl, and substituted forms of the foregoing in which one or more or even all hydrogen atoms are substituted by halogen. Inter alia, methyl and phenyl are preferred. The subscript n is an integer of 1,000 to 100,000, preferably 3,000 to 500,000, and more preferably 5,000 to 10,000.

The organosiloxane resin is a copolymer comprising $R_3SiO_{1/2}$ units (M units) and $SiO_{4/2}$ units (Q units) wherein a molar ratio of $R_3SiO_{1/2}$ units to $SiO_{4/2}$ units is preferably from 0.6 to 1.7, more preferably from 0.8 to 1.5. The copolymer may further contain $RSiO_{3/2}$ units (T units) and $R_2SiO_{2/2}$ units (D units) in an amount of up to 20 mol %, preferably up to 10 mol % of the overall copolymer.

R is each independently a monovalent hydrocarbon group, preferably a substituted or unsubstituted, $C_1$-$C_{10}$ monovalent hydrocarbon group or a hydroxyl group. Examples of the monovalent hydrocarbon group R include alkyl groups such as methyl, ethyl, n-propyl, isopropyl, n-butyl, tert-butyl, n-pentyl, cyclopentyl, and n-hexyl, cycloalkyl groups such as cyclohexyl, and aryl groups such as phenyl and tolyl, and substituted forms of the foregoing in which one or more or even all hydrogen atoms are substituted by halogen. Hydroxyl is another example of R. Inter alia, methyl is preferred.

The organopolysiloxane resin should preferably contain in the molecule a silicon-bonded hydroxyl group (i.e., silanol group) in a proportion 010.12 to 0.02 mol %/100 g, more preferably 0.10 to 0.04 mol %/100 g. Also the organopolysiloxane resin should preferably have a weight average molecular weight (Mw) of 500 to 20,000, more preferably 1,000 to 10,000 as measured versus polystyrene standards by gel permeation chromatography (GPC).

The (partial) dehydration condensate is obtained by combining the linear or branched organopolysiloxane and the organopolysiloxane resin in a weight ratio of from 99:1 to 50:50, more preferably from 98:2 to 85:15, and even more preferably from 97:3 to 90:10, and effecting (partial) dehydration condensation reaction in a standard manner. The thus obtained (partial) dehydration condensate preferably has a Mw of 200,000 to 2,000,000, more preferably 350,000 to 1,500,000.

The silicone base adhesive is used in solution form by combining 100 parts by weight of the dehydration condensate with about 400 to 1,000,000 parts by weight of an organic solvent such as nonane, isododecane or p-menthane. The resulting solution is applied and dried to form a desired coating. The silicone base adhesive may further contain various additives such as antioxidant, pigment, dye and filler.

The thickness of the adhesive layer in step (a) is not particularly limited and is selected as appropriate for a particular purpose although a thickness of 1 to 500 μm, especially 10 to 200 μm is preferred. Between the handle substrate and the adhesive layer, another layer such as a cured layer may intervene if desired. The optional intervening layer is preferably designed such that it may be separated together when the handle substrate is separated.

Examples of the handle substrate used in step (a) include silicon substrates, glass substrates and quartz substrates. The substrate is typically a semiconductor substrate having a circuit-bearing front surface and a back surface to be processed. The adhesive composition is applied to the substrate or the handle substrate by any well-known coating techniques such as spin coating so as to form an adhesive layer having the desired thickness. Then the substrate and the handle substrate are bonded together via the adhesive layer.

Step (b) is to process the substrate bonded to the handle substrate. Specifically, the back surface of the substrate (typically semiconductor substrate) bonded to the handle substrate is processed, typically by grinding, polishing or otherwise machining, for thereby thinning the substrate. In step (b), various processes used on wafer level are involved. Exemplary processes include electrode formation, metal interconnect formation, and protective film formation. More specifically, prior art well-known semiconductor processes are enumerated including metal sputtering for formation of electrodes or the like, wet etching of sputtered metal layer, pattern formation via resist film coating, exposure and development to form a mask for metal interconnect formation, resist film stripping, dry etching, metallization, silicon etching for TSV formation, and oxide film formation on silicon surface.

The thickness of a thin substrate into which the substrate is processed is typically in a range of 5 to 300 μm, more typically 10 to 100 μm although the thickness is not particularly limited.

Step (c) is to separate the thin substrate (as processed) from the handle substrate.

Specifically, the thin substrate is separated from the handle substrate, by a suitable separating technique such as mechanical peeling or solvent stripping. Since the substrate and the handle substrate are bonded via the adhesive layer as described in step (a), it is desirable that the adhesive layer be separated integral with the handle substrate. In separating step (c), however, the adhesive layer is not always kept entirely bonded to the handle substrate and rather some adhesive remains on the thin substrate. That is, part of the adhesive layer may remain on the substrate after separation.

This is followed by step (d) of cleaning the surface of the thin substrate, i.e., cleaning away adhesive residues on the thin substrate with the cleaner composition of the invention. In this way, the adhesive on the thin substrate is completely removed.

Step (d) is to clean away the adhesive layer remaining on the substrate after separation, with the cleaner composition, that is, cleaning step for removal of any remaining adhesive on the thin substrate. Specifically, the thin substrate having some adhesive remaining thereon is immersed in the cleaner composition of selected components, and treated by suitable means such as ultrasonic cleaning whereby the adhesive is cleaned away. For example, ultrasonic cleaning conditions may be selected depending on the surface state of the thin substrate and typically include 20 kHz to 5 MHz for 10 seconds to 30 minutes. By ultrasonic cleaning under such conditions, the adhesive is fully removed from the thin substrate.

Preferably the thin substrate (with adhesive residues) is immersed in a solvent prior to step (d). The solvent used for previous immersion is not particularly limited as long as the adhesive dissolves therein. Exemplary solvents include nonane, pentane, hexane, cyclohexane, decane, isododecane and limonene. In the immersion step, the solvent may be heated at a suitable temperature. Specifically, the substrate is immersed in a solvent at a temperature of 10 to 80° C., preferably 15 to 65° C. for 30 seconds to 30 minutes, whereby extra adhesive residues are removed.

While the method for preparing a thin substrate involves steps (a) to (d) as mentioned above, any well-known steps may be added. Any of the constructive and methodical elements described in steps (a) to (d) may be modified as long as they do not deviate from the scope of the invention.

EXAMPLE

Examples of the invention are given below by way of illustration and not by way of limitation. All parts are by weight. Mw is weight average molecular weight.

Silicone Compound Nonane Solution Adhesive No. 1

In a four-necked flask, 90 parts of gum-like dimethylpolysiloxane capped at both ends of the molecular chain with hydroxyl groups (of formula (1) wherein n=9,000), having a viscosity of 98,000 mPa·s at 25° C. as measured in 30 wt % toluene solution and 10 parts of methylpolysiloxane resin consisting of 0.75 mol of $(CH_3)_3SiO_{1/2}$ units and 1 mol of $SiO_{4/2}$ units, containing 1.0 mol % of hydroxyl groups in 100 g of solids, and having a Mw of 5,000 were dissolved in 900 parts of toluene. To the solution was added 1 part of 28 wt % aqueous ammonia. The solution was stirred at room temperature for 24 hours for condensation reaction. The reaction solution was heated at 180° C. under reduced pressure to remove toluene, water of condensation, ammonia and the like, obtaining a partial dehydration condensate in solid form. The partial dehydration condensate, 100 parts, was dissolved in 900 parts of toluene. To the solution was added 20 parts of hexamethyldisilazane. The solution was stirred at 130° C. for 3 hours to cap any remaining hydroxyl groups. The reaction solution was heated at 180° C. under reduced pressure to remove the solvent and the like, obtaining a non-reactive partial dehydration condensate in solid form. The non-reactive partial dehydration condensate, 100 parts, was dissolved in 900 parts of hexane, which was admitted into 2,000 parts of acetone. The resin precipitate was collected, from which hexane or the like was removed in vacuum. There was obtained a dimethylsiloxane polymer having a Mw of 900,000 and containing 0.05 wt % of a low molecular weight fraction having a molecular weight of up to 740. Finally a mixture consisting of 10 parts of the dimethylsiloxane polymer and 90 parts of nonane was obtained, designated "Silicone compound nonane solution adhesive No. 1."

Silicone compound nonane solution adhesive No. 2

In a four-necked flask, 95 parts of gum-like dimethylpolysiloxane capped at both ends of the molecular chain with hydroxyl groups (of formula (1) wherein n=9,000), having a viscosity of 98,000 mPa·s at 25° C. as measured in 30 wt % toluene solution and 5 parts of methylpolysiloxane resin consisting of 0.75 mol of $(CH_3)_3SiO_{1/2}$ units and 1 mol of $SiO_{4/2}$ units, containing 1.0 mol % of hydroxyl groups in 100 g of solids, and having a Mw of 5,000 were dissolved in 900 parts of toluene. To the solution was added 1 part of 28 wt % aqueous ammonia. The solution was stirred at room temperature for 24 hours for condensation reaction. The reaction solution was heated at 180° C. under reduced pressure to remove toluene, water of condensation, ammonia and the like, obtaining a partial dehydration condensate in solid form. The partial dehydration condensate, 100 parts, was dissolved in 900 parts of toluene. To the solution was added 20 parts of hexamethyldisilazane. The solution was stirred at 130° C. for 3 hours to cap any remaining hydroxyl groups. The reaction solution was heated at 180° C. under reduced pressure to remove the solvent and the like, obtaining a non-reactive partial dehydration condensate in solid form. The non-reactive partial dehydration condensate, 100 parts, was dissolved in 900 parts of hexane, which was admitted into 2,000 parts of acetone. The resin precipitate was collected, from which hexane or the like was removed in vacuum. There was obtained a dimethylsiloxane polymer having a Mw of 800,000 and containing 0.05 wt % of a low molecular weight fraction having a molecular weight of up to 740. Finally a mixture consisting of 10 parts of the dimethylsiloxane polymer and 90 parts of nonane was obtained, designated "Silicone compound nonane solution adhesive No. 2."

Preparation of Substrate

The silicone compound nonane solution adhesive prepared above was spin coated onto a 8-inch silicon semiconductor substrate (diameter 200 mm, thickness 725 μm) to form an adhesive layer of 10 μm thick. In a vacuum bonding apparatus, a 8-inch glass substrate (glass wafer) serving as handle substrate was bonded to the adhesive layer-bearing silicon semiconductor substrate at 200° C., obtaining a laminate of silicon semiconductor substrate, adhesive layer, and handle substrate. Using a grinder, the back surface of the silicon semiconductor substrate was ground until the substrate was thinned to a final thickness of 50 μm. Subsequently, while the silicon semiconductor substrate in the laminate was secured horizontally, the handle substrate was separated from the laminate. The substrate was immersed in nonane for 5 minutes and dried, yielding a thin silicon semiconductor substrate for cleaning test. In the separating step, about 10 wt % of the adhesive layer was carried over with the handle substrate and thus removed from the substrate. In the immersion step, about 99 wt % of the residual adhesive layer on the substrate was removed by nonane immersion. As a result, about 1 wt % of the adhesive layer remained on the thin silicon semiconductor substrate for cleaning test. Notably, Examples 1 to 15 and Comparative Examples 1 to 7 used Silicone compound nonane solution adhesive No. 1 and Example 16 used Silicone compound nonane solution adhesive No. 2.

Example 1

A 500-ml flask equipped with a stirrer, cooling unit and thermometer was charged with 0.43 g of 1 wt % potassium hydroxide/2-propanol solution and 99.57 g of isododecane, which were stirred at room temperature until uniform, yielding cleaner composition A.

Example 2

A similar flask was charged with 0.72 g of 1 wt % potassium hydroxide/2-propanol solution and 99.28 g of isododecane, which were stirred at room temperature until uniform, yielding cleaner composition B.

Example 3

A similar flask was charged with 1.15 g of 1 wt % potassium hydroxide/2-propanol solution and 98.85 g of isododecane, which were stirred at room temperature until uniform, yielding cleaner composition C.

Example 4

A similar flask was charged with 2.87 g of 1 wt % potassium hydroxide/2-propanol solution and 97.13 g of isododecane, which were stirred at room temperature until uniform, yielding cleaner composition D.

Example 5

A similar flask was charged with 0.43 g of 1 wt % potassium hydroxide/2-propanol solution and 99.57 g of dipropylene glycol dimethyl ether, which were stirred at room temperature until uniform, yielding cleaner composition E.

Example 6

A similar flask was charged with 0.72 g of 1 wt % potassium hydroxide/2-propanol solution and 99.28 g of dipropylene glycol dimethyl ether, which were stirred at room temperature until uniform, yielding cleaner composition F.

Example 7

A similar flask was charged with 1.15 g of 1 wt % potassium hydroxide/2-propanol solution and 98.85 g of dipropylene glycol dimethyl ether, which were stirred at room temperature until uniform, yielding cleaner composition G.

Example 8

A similar flask was charged with 2.87 g of 1 wt % potassium hydroxide/2-propanol solution and 97.13 g of dipropylene glycol dimethyl ether, which were stirred at room temperature until uniform, yielding cleaner composition H.

Example 9

A similar flask was charged with 1.74 g of 1 wt % potassium hydroxide/2-propanol solution and 98.26 g of isododecane, which were stirred at room temperature until uniform, yielding cleaner composition I.

Example 10

A similar flask was charged with 0.72 g of 1 wt % potassium hydroxide/1-butanol solution, 0.87 g of 1 wt % sodium hydroxide/1-butanol solution, and 98.41 g of isododecane, which were stirred at room temperature until uniform, yielding cleaner composition J.

Example 11

A similar flask was charged with 1.44 g of 1 wt % potassium hydroxide/1-pentanol solution, 0.87 g of 1 wt % sodium hydroxide/1-pentanol solution, and 97.69 g of isododecane, which were stirred at room temperature until uniform, yielding cleaner composition K.

Example 12

A similar flask was charged with 1.00 g of 1 wt % potassium hydroxide/1-hexanol solution and 99.00 g of isododecane, which were stirred at room temperature until uniform, yielding cleaner composition L.

Example 13

A similar flask was charged with 1.39 g of 1 wt % potassium hydroxide/2-propanol solution and 98.61 g of isooctane, which were stirred at room temperature until uniform, yielding cleaner composition M.

Example 14

A similar flask was charged with 0.86 g of 1 wt % potassium hydroxide/2-propanol solution and 99.14 g of isononane, which were stirred at room temperature until uniform, yielding cleaner composition N.

Example 15

A similar flask was charged with 0.72 g of 1 wt % potassium hydroxide/2-propanol solution, 0.52 g of 1 wt % sodium hydroxide/2-propanol solution, and 98.76 g of p-menthane, which were stirred at room temperature until uniform, yielding cleaner composition 0.

Example 16

The silicon semiconductor substrate coated with Silicone compound nonane solution adhesive No. 2 was subjected to a similar cleaning test using cleaner composition C in Example 3.

Comparative Example 1

A 500-ml flask equipped with a stirrer, cooling unit and thermometer was charged with 1.43 g of 2-propanol and 98.57 g of isododecane, which were stirred at room temperature, yielding cleaner composition R.

Comparative Example 2

A similar flask was charged with 0.17 g of 1 wt % potassium hydroxide/2-propanol solution and 99.83 g of isododecane, which were stirred at room temperature until uniform, yielding cleaner composition S.

Comparative Example 3

A similar flask was charged with 7.21 g of 1 wt % potassium hydroxide/2-propanol solution and 92.79 g of isododecane, which were stirred at room temperature until uniform, yielding cleaner composition T.

Comparative Example 4

A similar flask was charged with 1.43 g of 2-propanol and 98.57 g of dipropylene glycol dimethyl ether, which were stirred at room temperature, yielding cleaner composition U.

Comparative Example 5

A similar flask was charged with 0.17 g of 1 wt % potassium hydroxide/2-propanol solution and 99.83 g of dipropylene glycol dimethyl ether, which were stirred at room temperature until uniform, yielding cleaner composition V.

Comparative Example 6

A similar flask was charged with 7.21 g of 1 wt % potassium hydroxide/2-propanol solution and 92.79 g of dipropylene glycol dimethyl ether, which were stirred at room temperature until uniform, yielding cleaner composition W.

Comparative Example 7

A similar flask was charged with 1.74 g of 1 wt % sodium potassium hydroxide/2-propanol solution, 1.0 g of water, and 97.26 g of dipropylene glycol dimethyl ether, which were stirred at room temperature until uniform, yielding cleaner composition X.

Using each of cleaner compositions A to O in Examples and cleaner compositions R to X in Comparative Examples, the silicon semiconductor substrate was ultrasonic cleaned. Ultrasonic cleaning was performed at frequency 1 MHz for 5 minutes. Each cleaner composition was evaluated according to the following criterion. In Examples 3 and 6 and Comparative Examples 2, 4 and 7, the bond strength between the silicon semiconductor substrate after cleaning and a molding material was measured. The results of Examples are shown in Tables 1 and 2 and the results of Comparative Examples are shown in Table 3. Notably the content (ppm) of Na and K is computed from the concentration of sodium hydroxide and potassium hydroxide.

Appearance of Cleaner Composition

The cleaner composition was visually observed for appearance. Faults like precipitate deposition and separation of water layer were inspected. The sample was rated good (O) when no faults were detected and poor (X) when faults were detected.

Appearance of Substrate Surface after Cleaning

Using the cleaner composition, the silicon semiconductor substrate was cleaned. Specifically, the silicon semiconductor substrate was immersed in the cleaner composition for 5 minutes, rinsed with flowing deionized water for 1 minute, and dried. The dry surface of the silicon semiconductor substrate was observed. It was rated good (O) when no defects were detected on the substrate surface and the substrate surface was equivalent to that prior to coating of the silicone compound nonane solution adhesive, and poor (X) when defects like fog and corrosion were detected on the substrate surface.

Evaluation of Cleaned Substrate Surface in Terms of Contact Angle after Cleaning Using the cleaner composition, the silicon semiconductor substrate was cleaned. Specifically, the silicon semiconductor substrate was immersed in the cleaner composition for 5 minutes, rinsed with flowing deionized water for 1 minute, and dried. The dry surface of the silicon semiconductor substrate was measured for a contact angle with water. The substrate had a contact angle with water of 108° prior to cleaning. A contact angle with water after 5 minutes of immersion cleaning is shown in Tables 1 to 3.

Analysis of Cleaned Substrate Surface in Terms of Silicone Content at Substrate Surface Using the cleaner composition, the silicon semiconductor substrate was cleaned. Specifically, the silicon semiconductor substrate was immersed in the cleaner composition for 5 minutes, rinsed with flowing deionized water for 1 minute, and dried. The dry surface of the silicon semiconductor substrate was analyzed by X-ray photoelectron spectroscopy. The substrate surface had a residual silicone content of 22 wt % prior to cleaning. The surface of the substrate after cleaning was regarded acceptable when its silicone content was reduced to 5 wt % or less. Tables 1 to 3 show the content of residual silicone on the substrate surface after cleaning.

Bond Strength Between Substrate after Cleaning and Molding Material

Using the cleaner composition, the silicon semiconductor substrate was cleaned. Specifically, the silicon semiconductor substrate was immersed in the cleaner composition for 5 minutes, rinsed with flowing deionized water for 1 minute, and dried. Onto the dry surface of the silicon semiconductor substrate, a molding material (liquid epoxy encapsulant, trade name SMC-375TGF-6 by Shin-Etsu Chemical Co., Ltd.) was molded so as to give a cross-sectional diameter of 5 mm and cured in two stages: first stage (120° C., 30 minutes) and second stage (165° C., 3 hours). At the end of curing, using a universal bond tester Serie 4000PXY by Dage, the bond strength between the semiconductor substrate and the molding material was measured. The semiconductor substrate showed a bond strength of 0.2 MFa prior to cleaning.

TABLE 1

|  | Example | | | | | | | | |
| --- | --- | --- | --- | --- | --- | --- | --- | --- | --- |
|  | 1 | 2 | 3 | 4 | 5 | 6 | 7 | 8 | 9 |
| Silicone compound nonane solution adhesive | No. 1 | No. 1 | No. 1 | No. 1 | No. 1 | No. 1 | No. 1 | No. 1 | No. 1 |
| Cleaner composition* | A | B | C | D | E | F | G | H | I |

TABLE 1-continued

|  |  | Example | | | | | | | | |
|---|---|---|---|---|---|---|---|---|---|---|
|  |  | 1 | 2 | 3 | 4 | 5 | 6 | 7 | 8 | 9 |
| Component (C) | potassium hydroxide | 0.0043 | 0.0072 | 0.0115 | 0.0287 | 0.0043 | 0.0072 | 0.0115 | 0.0287 | |
|  | sodium hydroxide | | | | | | | | | 0.0174 |
| Component (B) | 2-propanol | 0.430 | 0.710 | 1.14 | 2.84 | 0.43 | 0.710 | 1.14 | 2.84 | 1.72 |
|  | 1-butanol | | | | | | | | | |
|  | 1-pentanol | | | | | | | | | |
|  | 1-hexanol | | | | | | | | | |
| Component (A) | isododecane | 99.57 | 99.28 | 98.85 | 97.13 | | | | | |
|  | dipropylene glycol dimethyl ether | | | | | 99.57 | 99.28 | 98.85 | 97.13 | 98.26 |
|  | isooctane | | | | | | | | | |
|  | isononane | | | | | | | | | |
|  | p-menthane | | | | | | | | | |
| Content of alkali metal (K, Na) in cleaner composition (ppm) | | 30 | 50 | 80 | 200 | 30 | 50 | 80 | 200 | 100 |
| Physical properties | Appearance of cleaner composition | ○ | ○ | ○ | ○ | ○ | ○ | ○ | ○ | ○ |
|  | Appearance of substrate surface after cleaning | ○ | ○ | ○ | ○ | ○ | ○ | ○ | ○ | ○ |
|  | Contact angle after cleaning (°) | 15 | 10 | 10 | 10 | 13 | 10 | 10 | 10 | 10 |
|  | Silicone content on substrate surface after cleaning (%) | 3 | 3 | 1 | 1 | 4 | 2 | 1 | 1 | 1 |
|  | Bond strength between substrate after cleaning and molding material (MPa) | | | >20 | | | | >20 | | |

*value of each component is wt %.

TABLE 2

|  |  | Example | | | | | | |
|---|---|---|---|---|---|---|---|---|
|  |  | 10 | 11 | 12 | 13 | 14 | 15 | 16 |
| Silicone compound nonane solution adhesive | | No. 1 | No. 1 | No. 1 | No. 1 | No. 1 | No. 1 | No. 2 |
| Cleaner composition* | | J | K | L | M | N | O | C |
| Component (C) | potassium hydroxide | 0.0072 | 0.0144 | 0.0100 | | 0.0086 | 0.0072 | 0.0115 |
|  | sodium hydroxide | 0.0087 | 0.0087 | | 0.0139 | | 0.0052 | |
| Component (B) | 2-propanol | | | | 1.38 | 0.85 | 1.23 | 1.14 |
|  | 1-butanol | 1.57 | | | | | | |
|  | 1-pentanol | | 2.29 | | | | | |
|  | 1-hexanol | | | 0.99 | | | | |
| Component (A) | isododecane | 98.41 | 97.69 | 99.00 | | | | 98.85 |
|  | dipropylene glycol dimethyl ether | | | | | | | |
|  | isooctane | | | | 98.61 | | | |
|  | isononane | | | | | 99.14 | | |
|  | p-menthane | | | | | | 98.76 | |
| Content of alkali metal (K, Na) in cleaner composition (ppm) | | 100 | 150 | 70 | 80 | 60 | 80 | 80 |
| Physical properties | Appearance of cleaner composition | ○ | ○ | ○ | ○ | ○ | ○ | ○ |
|  | Appearance of substrate surface after cleaning | ○ | ○ | ○ | ○ | ○ | ○ | ○ |
|  | Contact angle after cleaning (°) | 10 | 10 | 10 | 10 | 10 | 10 | 10 |
|  | Silicone content on substrate surface after cleaning (%) | 2 | 2 | 1 | 3 | 3 | 2 | 1 |
|  | Bond strength between substrate after cleaning and molding material (MPa) | | | | | | | |

*value of each component is wt %.

TABLE 3

| | | Comparative Example | | | | | | |
|---|---|---|---|---|---|---|---|---|
| | | 1 | 2 | 3 | 4 | 5 | 6 | 7 |
| Silicone compound nonane solution adhesive | | No. 1 | No. 1 | No. 1 | No. 1 | No. 1 | No. 1 | No. 1 |
| Cleaner composition* | | R | S | T | U | V | W | X |
| Component (C) | potassium hydroxide | | 0.0017 | 0.0714 | | 0.0017 | 0.0714 | |
| | sodium hydroxide | | | | | | | 0.0174 |
| Component (B) | 2-propanol | 1.43 | 0.172 | 7.14 | 1.43 | 0.172 | 7.14 | 1.72 |
| | 1-butanol | | | | | | | |
| | water | | | | | | | 1.00 |
| Component (A) | isododecane | 98.57 | 99.83 | 92.79 | | | | |
| | dipropylene glycol dimethyl ether | | | | 98.57 | 99.83 | 92.79 | 97.26 |
| Content of alkali metal (K, Na) in cleaner composition (ppm) | | 0 | 10 | 500 | 0 | 10 | 500 | 100 |
| Physical properties | Appearance of cleaner composition | ○ | ○ | X | ○ | ○ | X | ○ |
| | Appearance of substrate surface after cleaning | ○ | ○ | X | ○ | ○ | X | X |
| | Contact angle after cleaning (°) | 105 | 75 | 50 | 105 | 60 | 50 | 105 |
| | Silicone content on substrate surface after cleaning (%) | 23 | 18 | 8 | 23 | 17 | 8 | 21 |
| | Bond strength between substrate after cleaning and molding material (MPa) | | 0.5 | | 0.3 | | | 0.3 |

*value of each component is wt %.

As seen from Tables 1 to 3, when silicon semiconductor substrates are cleaned with cleaner compositions within the scope of the invention, a satisfactory degree of cleanness is achieved within a short time and at a high efficiency without causing corrosion to the substrate.

With respect to the bond strength between silicon semiconductor substrate after cleaning and molding material, Examples of the invention show an outstandingly higher bond strength than Comparative Examples.

Japanese Patent Application No. 2016-088020 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A cleaner composition for cleaning a surface of a substrate, consisting essentially of
    (A) 90.0 to 99.9% by weight of an organic solvent exclusive of an alcohol of 3 to 6 carbon atoms, and
    (B) 0.1 to 10.0% by weight of an alcohol of 3 to 6 carbon atoms,
    the composition containing (C) sodium and/or potassium in an amount of 0.002 to 0.03 part by weight per 100 parts by weight of components (A) and (B) combined,
    wherein the organic solvent (A) is an aliphatic hydrocarbon of 5 to 20 carbon atoms or a dialkylene glycol dialkyl ether of 5 to 20 carbon atoms, wherein the composition is free of water.

2. The cleaner composition of claim 1 wherein component (C) is present in the form of sodium hydroxide and/or potassium hydroxide.

3. The cleaner composition of claim 1 wherein the organic solvent (A) is an aliphatic hydrocarbon of 5 to 20 carbon atoms.

4. The cleaner composition of claim 1 wherein the organic solvent (A) is a dialkylene glycol dialkyl ether of 5 to 20 carbon atoms.

5. The cleaner composition of claim 1, further comprising a quaternary ammonium salt.

6. The cleaner composition of claim 1 wherein the substrate is a semiconductor substrate.

7. A method for preparing a thin substrate, comprising the steps of
    (a) forming an adhesive layer on a substrate or handle substrate from an adhesive composition and bonding the substrate and the handle substrate via the adhesive layer,
    (b) processing the substrate bonded to the handle substrate,
    (c) separating the substrate as processed from the handle substrate, the adhesive layer remaining on the substrate after separation, and
    (d) cleaning away the adhesive layer on the substrate with the cleaner composition, wherein the cleaner composition consisting essentially of
    (A) 90.0 to 99.9% by weight of an organic solvent exclusive of an alcohol of 3 to 6 carbon atoms, and
    (B) 0.1 to 10.0% by weight of an alcohol of 3 to 6 carbon atoms,
    the composition containing (C) sodium and/or potassium in an amount of 0.002 to 0.03 part by weight per 100 parts by weight of components (A) and (B) combined,
    wherein the organic solvent (A) is an aliphatic hydrocarbon of 5 to 20 carbon atoms or a dialkylene glycol dialkyl ether of 5 to 20 carbon atoms, wherein the composition is free of water.

8. The method of claim 7 wherein the adhesive composition comprises a silicone compound.

9. The method of claim 8 wherein the silicone compound is a partial dehydration condensate of a linear or branched organopolysiloxane having at least two silicon-bonded hydroxyl groups with an organopolysiloxane resin comprising $R_3SiO_{1/2}$ units wherein R is a monovalent hydrocarbon group and $SiO_2$ units and containing a hydroxyl group.

10. The cleaner composition of claim 1 wherein the aliphatic hydrocarbon of the organic solvent (A) is one or more kinds selected from the group consisting of octane, nonane, decane, undecane, dodecane, tetradecane, hexadecane, isooctane, isononane, isodecane, isododecane, alkylcyclohexanes, and p-menthane.

11. The cleaner composition of claim 1, wherein the substrate surface cleaned with the cleaner composition has a contact angle with water of less than 100°.

\* \* \* \* \*